United States Patent
Huang et al.

(10) Patent No.: US 9,391,201 B2
(45) Date of Patent: Jul. 12, 2016

(54) SOURCE/DRAIN STRUCTURE AND MANUFACTURING THE SAME

(71) Applicant: Taiwan Semiconductor Manufacturing Company, Ltd., Hsin-Chu (TW)

(72) Inventors: Yu-Lien Huang, Hsin-Chu (TW); Tung Ying Lee, Hsin-Chu (TW); Winnie Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/552,904

(22) Filed: Nov. 25, 2014

(65) Prior Publication Data

US 2016/0149036 A1    May 26, 2016

(51) Int. Cl.
*H01L 29/08* (2006.01)
*H01L 29/78* (2006.01)
*H01L 29/66* (2006.01)

(52) U.S. Cl.
CPC ...... *H01L 29/7848* (2013.01); *H01L 29/66545* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 7,425,740 B2 | 9/2008 | Liu et al. | |
| 8,048,723 B2 | 11/2011 | Chang et al. | |
| 8,053,299 B2 | 11/2011 | Xu | |
| 8,183,627 B2 | 5/2012 | Currie | |
| 8,415,718 B2 | 4/2013 | Xu | |
| 8,497,177 B1 | 7/2013 | Chang et al. | |
| 8,609,518 B2 | 12/2013 | Wann et al. | |
| 8,618,556 B2 | 12/2013 | Wu et al. | |
| 8,633,516 B1 | 1/2014 | Wu et al. | |
| 8,703,565 B2 | 4/2014 | Chang et al. | |
| 8,742,509 B2 | 6/2014 | Lee et al. | |
| 8,776,734 B1 | 7/2014 | Roy et al. | |
| 8,785,285 B2 | 7/2014 | Tsai et al. | |
| 8,796,666 B1 | 8/2014 | Huang et al. | |
| 8,815,712 B2 | 8/2014 | Wan et al. | |
| 2012/0091538 A1* | 4/2012 | Lin .................. | H01L 29/66795 257/401 |
| 2012/0138886 A1* | 6/2012 | Kuhn .................. | B82Y 10/00 257/9 |
| 2013/0285153 A1 | 10/2013 | Lee et al. | |
| 2014/0183600 A1 | 7/2014 | Huang et al. | |
| 2014/0264590 A1 | 9/2014 | Yu et al. | |
| 2014/0264592 A1 | 9/2014 | Oxland et al. | |

* cited by examiner

*Primary Examiner* — Daniel Whalen
(74) *Attorney, Agent, or Firm* — Haynes and Boone, LLP (57) ABSTRACT

A fin-like field-effect transistor (FinFET) device is disclosed. The device includes a semiconductor substrate having a source/drain region, a plurality of isolation regions over the semiconductor substrate and a source/drain feature in the source/drain region. The source/drain feature includes a multiple plug-type portions over the substrate and each of plug-type portion is isolated each other by a respective isolation region. The source/drain feature also includes a single upper portion over the isolation regions. Here the single upper portion is merged from the multiple plug-type portions. The single upper portion has a flat top surface facing away from a top surface of the isolation region.

20 Claims, 13 Drawing Sheets

SOURCE/DRAIN STRUCTURE AND MANUFACTURING THE SAME

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, a more flexible integration for forming an strain booster for a channel region is desired.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 1:
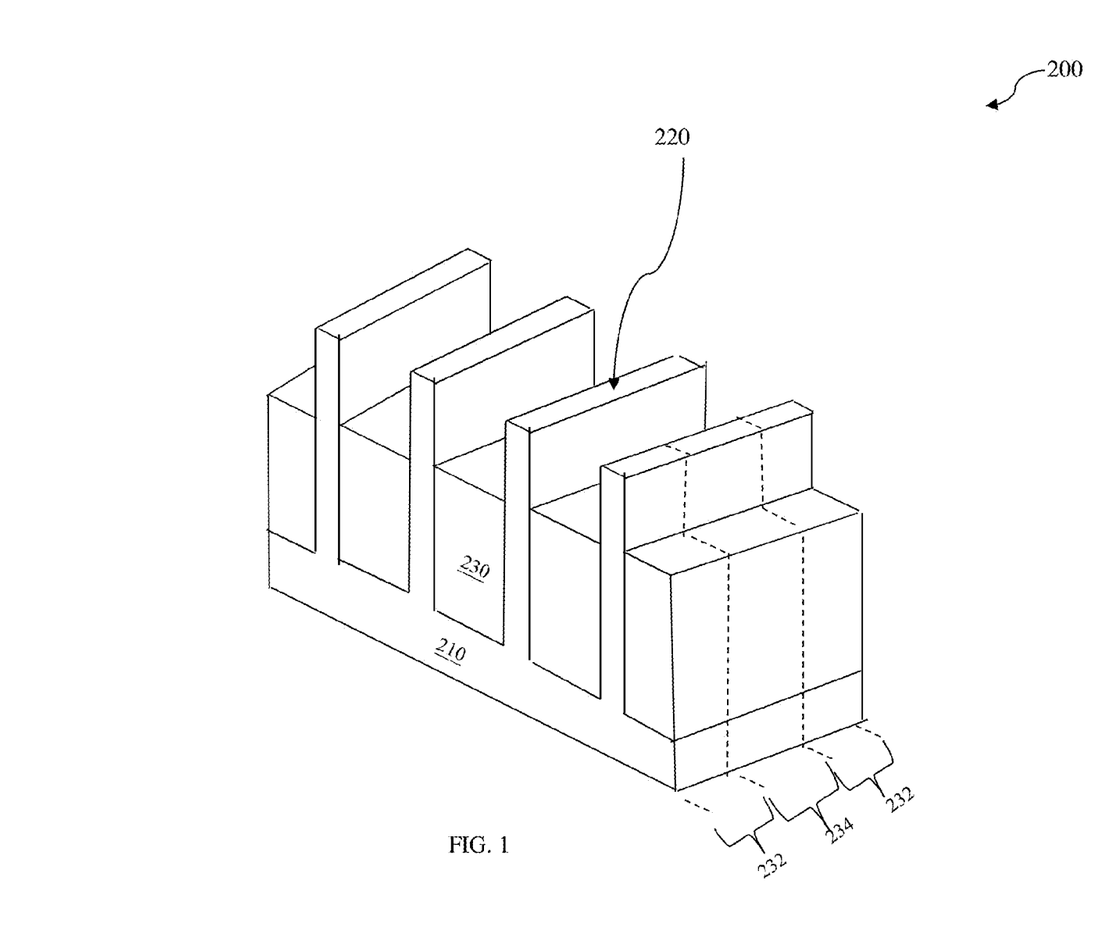
FIG. 1 is a diagrammatic perspective view of an example FinFET device in accordance with some embodiments.

FIG. 1 illustrates a plurality of fin features 220 and isolation regions 230 formed over a substrate 210. The substrate 210 may be a bulk silicon substrate. Alternatively, the substrate 210 may comprise an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 210 also include a silicon-on-insulator (SOI) substrate. SOI substrates are fabricated using separation by implantation of oxygen (SIMOX), wafer bonding, and/or other suitable methods.

Some exemplary substrates 210 also include an insulator layer. The insulator layer comprises any suitable material, including silicon oxide, sapphire, and/or combinations thereof. An exemplary insulator layer may be a buried oxide layer (BOX). The insulator is formed by any suitable process, such as implantation (e.g., SIMOX), oxidation, deposition, and/or other suitable process. In some exemplary FinFET precursors 200, the insulator layer is a component (e.g., layer) of a silicon-on-insulator substrate.

The substrate 210 may also include various doped regions. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor (MOS) transistor device and regions configured for a P-type MOS transistor device.

The fin features 220 are formed by any suitable process including various deposition, photolithography, and/or etching processes. In one embodiment, the fin features 220 are formed by patterning and etching a portion of the substrate 210. Various isolation regions 230 are formed on the substrate 210 to isolate active regions. For example, the isolation regions 230 separate fin features 220. The isolation region 230 may be formed using traditional isolation technology, such as shallow trench isolation (STI), to define and electrically isolate the various regions. The isolation region 230 includes silicon oxide, silicon nitride, silicon oxynitride, an air gap, other suitable materials, or combinations thereof. The isolation region 230 is formed by any suitable process. In the present embodiment, an upper portion of the fin feature 220 is exposed above the isolation region 230.

In some embodiments, the substrate 210 has source/drain regions (S/D) 232 and a gate region 234. In some embodiments, a S/D 232 is a source region, and another S/D region 232 is a drain region. The S/D 232 are separated by the gate region 234.

Figure 2A:
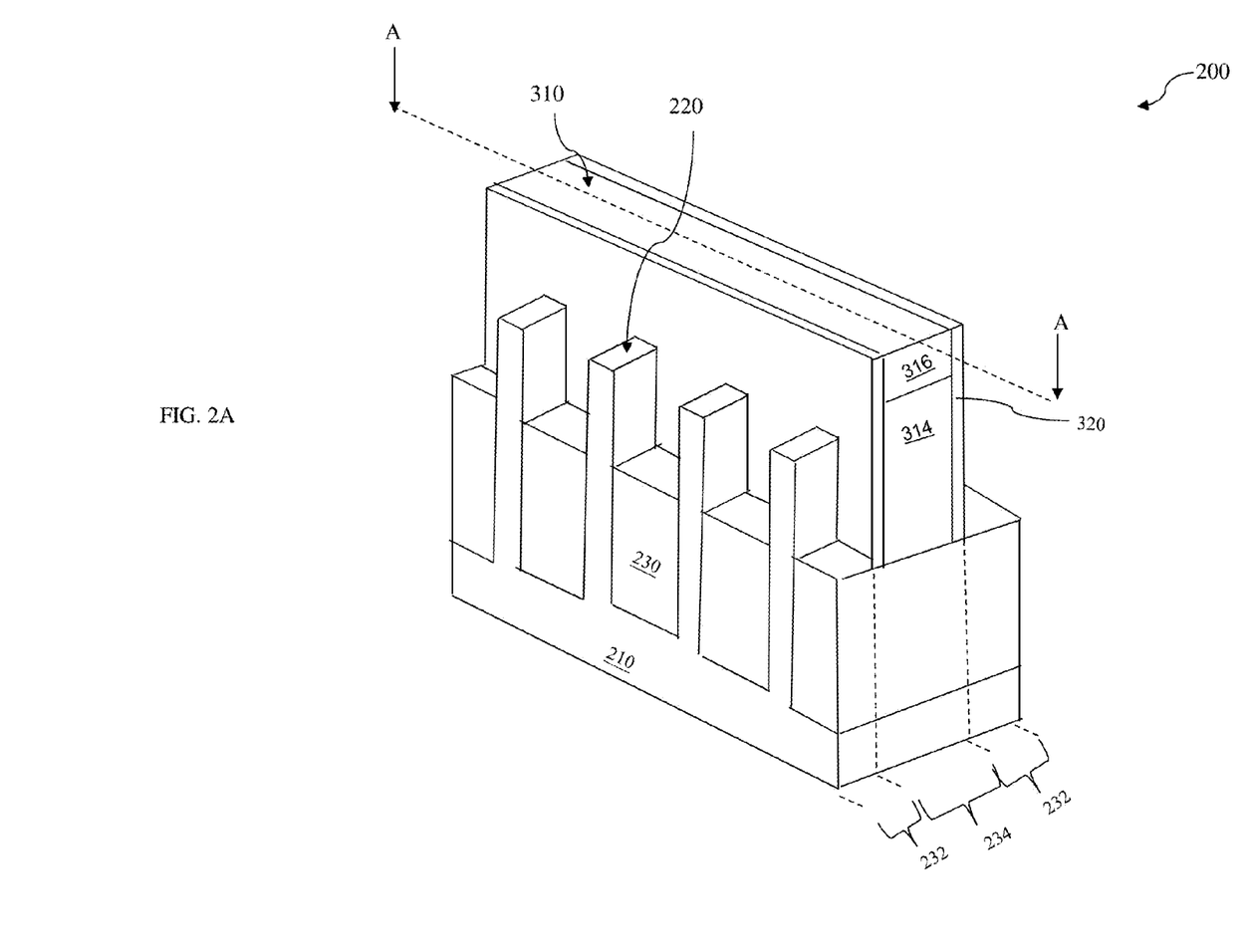
FIG. 2A is a diagrammatic perspective view of an example FinFET device in accordance with some embodiments.
Figure 2B:
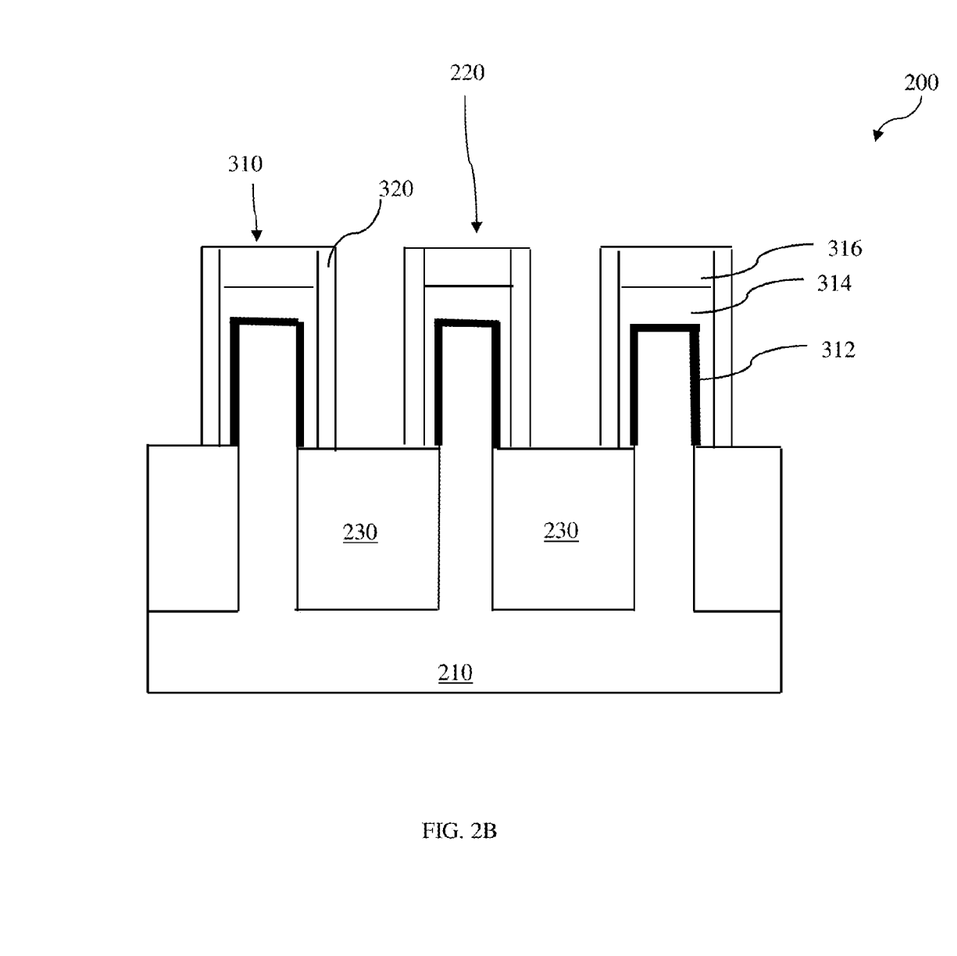
FIG. 2B is a cross-sectional view of an example FinFET device along the line A-A in FIG. 2A

FIGS. 2A and 2B illustrate first gate stacks 310 are formed over the substrate 210, including wrapping over the exposed upper portion of the fin feature 220 in the gate region 234. The first gate stack 310 may include a gate dielectric layer 312 and a gate electrode 314. In the present embodiment, the first gate stacks 310 include dummy gate stacks and they will be replaced by a final gate stack at a subsequent stage. Particularly, the dummy gate stack 310 is to be replaced later by a high-k dielectric/metal gate (HK/MG) after high thermal temperature processes, such as thermal annealing for source/drain activation during the sources/drains formation. In one embodiment, the first dummy gate stack 310 includes the dummy dielectric layer 312 and polycrystalline silicon (polysilicon) 314. A gate hard mask (HM) 316 is formed over the gate electrode 314. The gate HM 316 may include silicon nitride, silicon oxynitride, silicon oxide, other suitable material, or a combination thereof.

FIGS. 2A and 2B also illustrate spacers 320 are formed along sidewalls of the first gate stacks 310. The spacer 320 may include a dielectric material (such as silicon oxide, silicon nitride or silicon carbide) but is different from the material of the dummy gate stack 310 to achieve etching selectivity during a subsequent etch process.

Figure 3A:
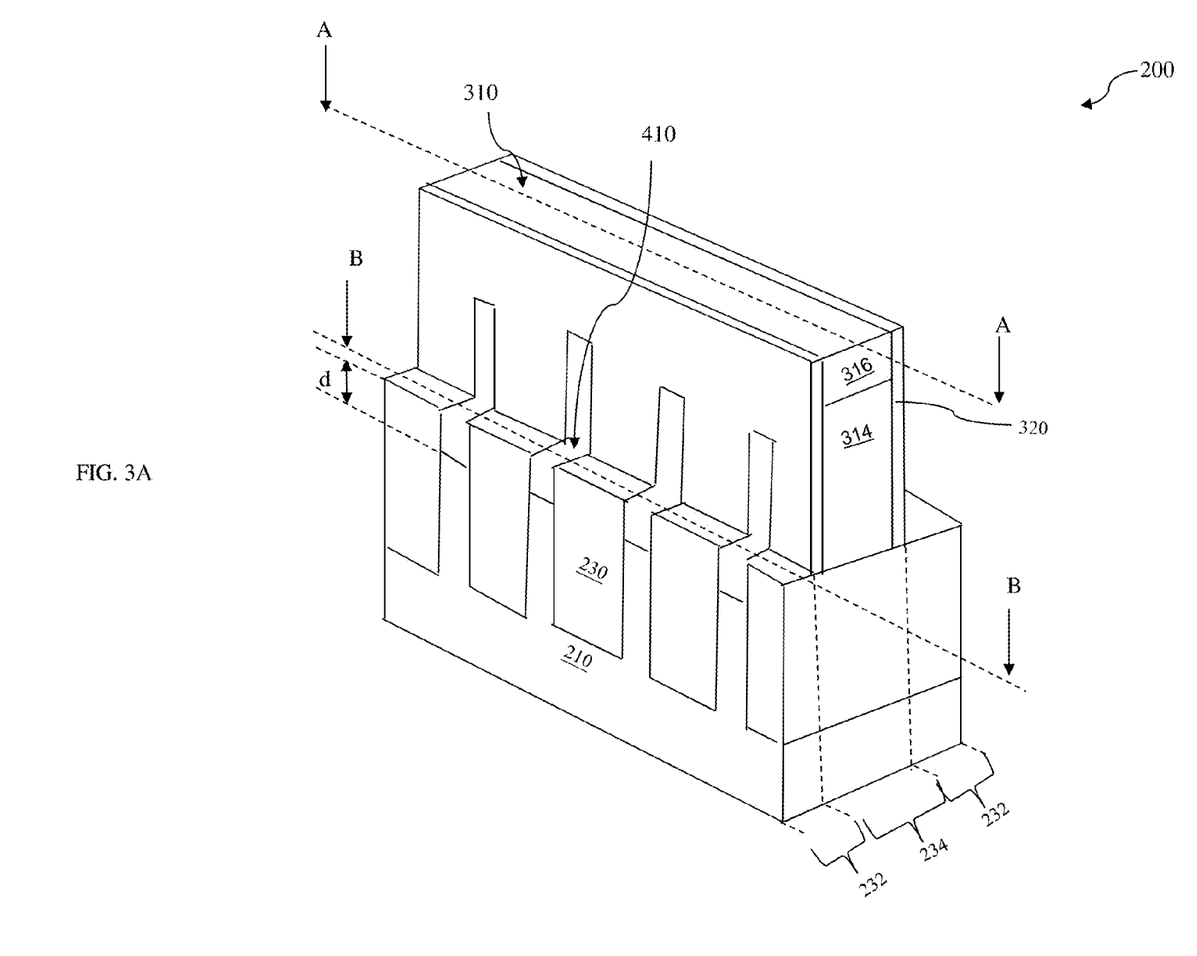
FIG. 3A is a diagrammatic perspective view of an example FinFET device in accordance with some embodiments
Figure 3B:
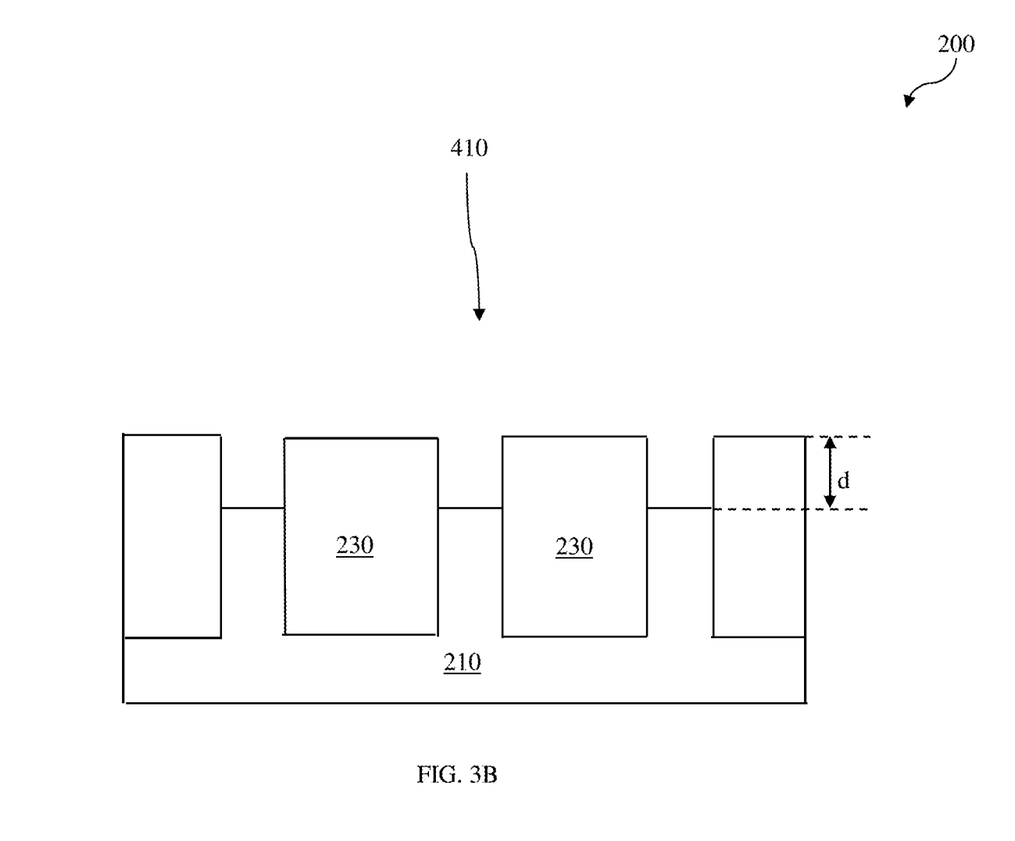
FIG. 3B is a cross-sectional view of an example semiconductor device along the line B-B in FIG. 3A.

FIGS. 3A-3B illustrate S/D recesses 410 formed on either side of the gate stack 310. The S/D recesses 410 are formed by removing portions of the fin features 220 at either side of the first gate stack 310. In the present embodiment, the S/D recesses 410 are formed in S/D regions 232, such that the first gate stack 310 interposes the S/D recesses 410 and a portion of the fin feature 220 in the gate region 234 is laterally exposed in the S/D recess 410. The S/D recesses 410 have a depth d. In one embodiment, the depth d is larger than 1 nm.

Figure 4A:
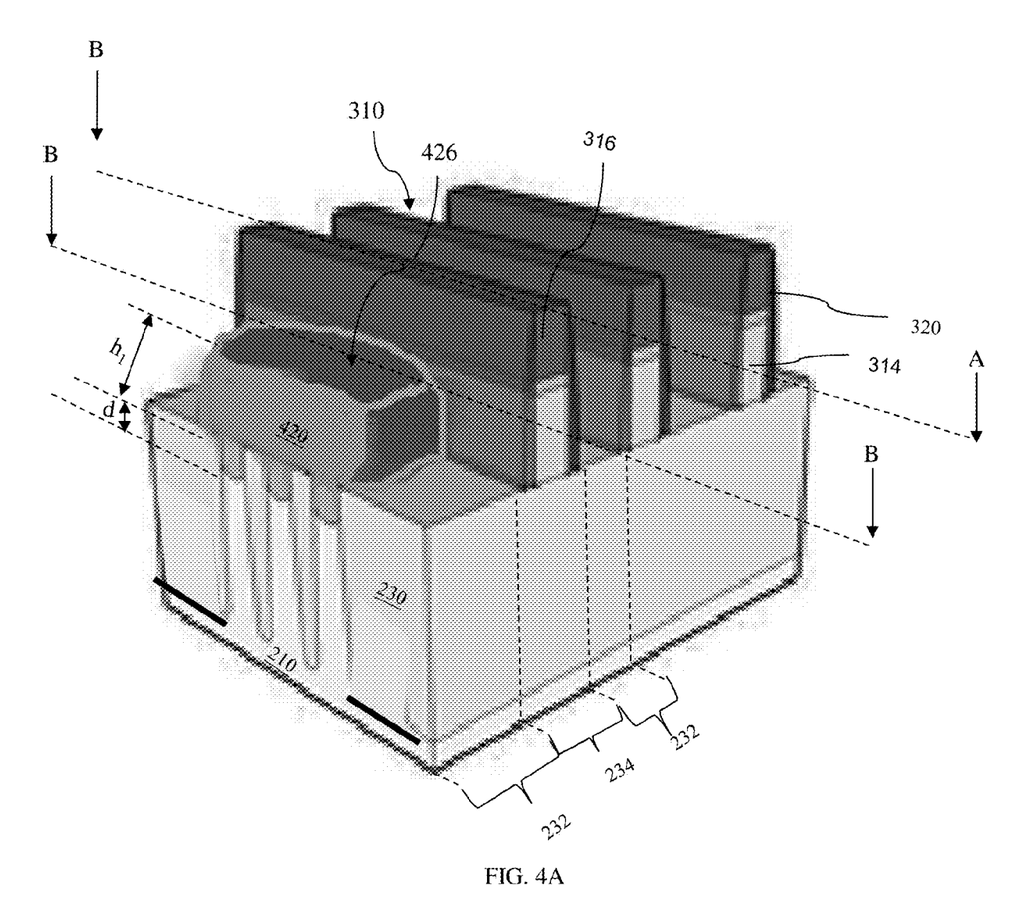
FIG. 4A is a diagrammatic perspective view of an example FinFET device in accordance with some embodiments

FIG. 4A illustrates a S/D feature 420 is formed by growing a S/D material in the S/D recesses 410 and continually growing the S/D material over the isolation regions and merging into a single feature. For the sake of clarity to better illustrate the concepts of the present disclosure, a lower portion of the S/D feature 420 grown within the S/D recess 410 is referred to as a plug-type portion 422 and an upper portion of the S/D feature 420, overgrown from individual plug-type portion 422 and merged more than one plug-type portion 422 into a single feature is referred to as a merged portion 424. Each of the plug-type portion 422 is separated by and embedded in the respective isolation region 230 while the merged portion 424 is over several isolation regions 230 and physical contacts to multiple fin feature 220 in the gate region 234.

The S/D features 420 may include germanium (Ge), silicon (Si), gallium arsenide (GaAs), aluminum gallium arsenide (AlGaAs), silicon germanium (SiGe), gallium arsenide phosphide (GaAsP), gallium antimony (GaSb), indium antimony (InSb), indium gallium arsenide (InGaAs), indium arsenide (InAs), or other suitable materials. The S/D feature 420 may be doped during its formation or by an implantation process. In one embodiment, the S/D feature 420 includes an epitaxially grown SiGe layer that is doped with boron. In another embodiment, the S/D feature 420 includes an epitaxially grown Si epi layer that is doped with phosphorous. In yet another embodiment, the S/D feature 420 includes an epitaxially grown Si epi layer that is doped with carbon.

Figure 4B:
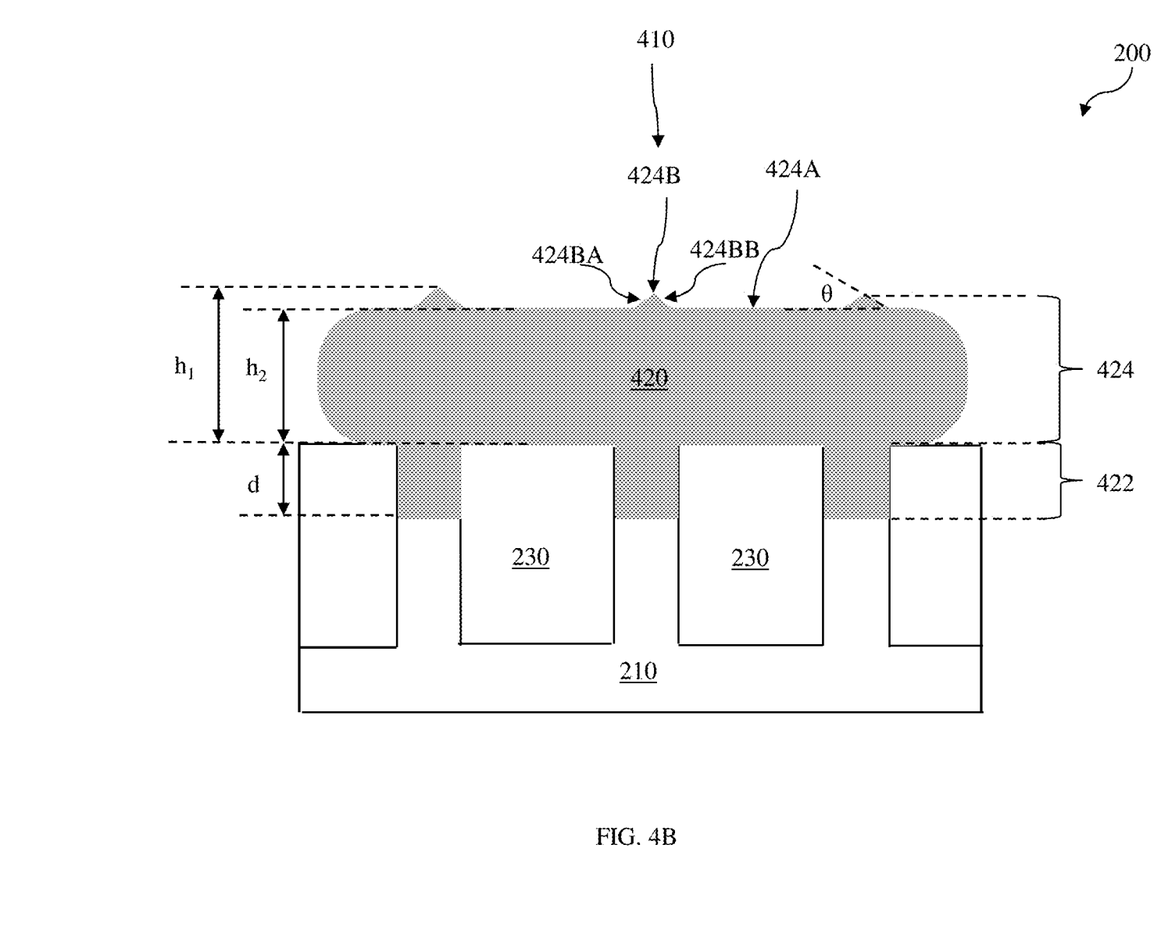
FIGS. 4B and 4C are cross-sectional views of an example FinFET device along the line B-B in FIG. 4A.

FIG. 4B illustrates, in the present embodiment, the merged portion 424 is formed with a quite flat top surface (facing away a top surface of the isolation region 230) to increase volume of the merged portion 424. In one embodiment, a ratio of the lowest height $h_2$ to the highest height $h_1$ of the merged portion 424 is larger than 90%. With a large volume of the merged portion 424, the S/D feature 420 may enhance strain effect on gate channel regions which will be formed later and a S/D resistance may be reduced as well.

In one embodiment, the S/D feature 420 includes SiGe. A top surface of the merged portion 424 of the SiGe S/D feature 420 includes a flat surface 424A and a plurality of multi-facet surface 424B in a repetitive manner. The flat surface 424A is parallel to a top surface of the isolation region 230. The multi-facet surface 424B is quite small and aligned to the S/D recess 410. In one example, the multi-facet surface 424B is a diamond shape and has two facets, 424BA and 424BB. Each facet has a (111) crystallographic orientation. The facets 424BA and 424BB have a fixed angle θ with the flat surface 424A. The facet 424BA starts from the flat surface 424A and meets an end of the facet 424BB; which also starts from the flat surface 424A. In this case, the lowest height $h_1$ of the merged portion 424 is a distance between the top surface of the isolation region 230 and the highest height $h_2$ is a distance between the top surface of the isolation region 230 and a point where the facet 424BA meets the facet 424BB.

Figure 4C:
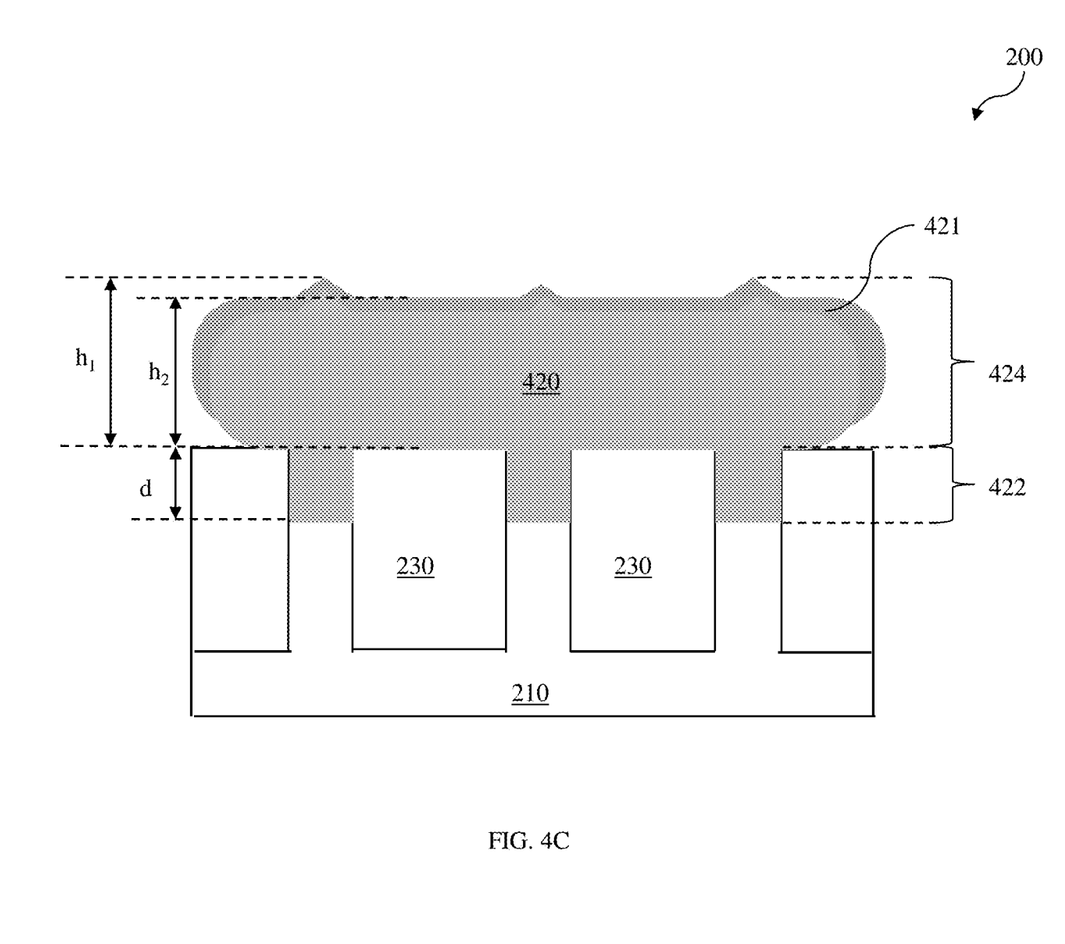

In one embodiment, the S/D feature 420 is formed by a multiple semiconductor layers grown over the S/D feature 420. For example, a second semiconductor layer 421 is formed over the S/D feature 420, as shown in FIG. 4C. The second semiconductor layer 421 has a different semiconductor material than the S/D feature 420. As an example, the S/D feature 420 includes epitaxial SiGe while the second semiconductor material layer 421 includes III-V semiconductor material. In one embodiment, the second semiconductor material layer 421 has the same top surface profile as the S/D feature 420.

Figure 5:
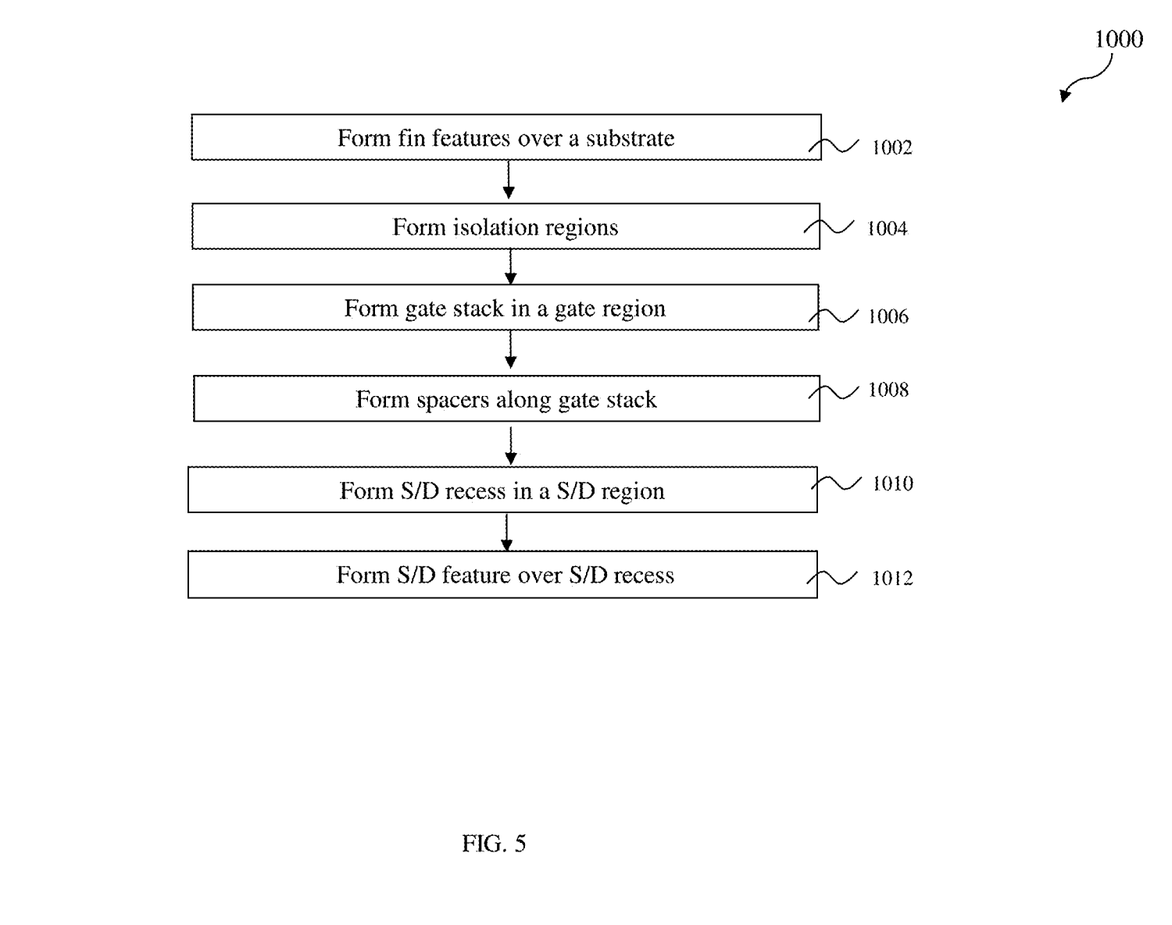
FIG. 5 is a flow chart of an example method for fabricating a FinFET device in accordance with some embodiments.

FIG. 5 is a flowchart of a method 1000 to form a FET constructed according to various aspects of the present disclosure in some embodiments. The method 1000 is described with reference to FIG. 5 and other figures. However, the FinFET device 200 (in FIGS. 4A-4C in the present embodiment) is provided as an example and is not intended to limit the scope of the method.

Referring to FIGS. 5 and 1, the method 1000 begins at step 1002 by forming fin features 220 over the substrate 210. In one embodiment, a patterned photoresist layer is formed over the substrate 210 by a lithography process and the substrate 210 is etched through openings of the patterned photoresist layer to form the fin features 220. An exemplary photolithography process may include forming a photoresist layer, exposing the resist by a lithography exposure process, performing a post-exposure bake process, and developing the photoresist layer to form the patterned photoresist layer. The etching process may include a wet etch or a dry etch. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH, other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

Referring again to FIGS. 5 and 1, the method 1000 proceeds to step 1004 by forming isolation regions 230 over the substrate 210. In one embodiment, isolation regions 230 are formed by depositing a dielectric layer over the substrate 210, including filling in spaces between fin features 220, and being followed by an etching back. The dielectric layer is etched back by a proper etching process, such as a selective wet etch, or a selective dry etch, or a combination thereof. In present embodiment, the recessing processes are controlled to expose the upper portion of the fin feature 220.

Referring to FIGS. 5 and 2A-2B, the method 1000 proceeds to step 1006 by forming the first gate stack 310 in the gate region 234, including wrapping over the exposed upper portion of the fin feature 220. The first gate stack 310 may be formed by a suitable procedure including deposition, lithography patterning and etching. In various examples, the deposition includes CVD, physical vapor deposition (PVD), ALD, thermal oxidation, other suitable techniques, or a combination thereof. The etching process includes dry etching, wet etching, and/or other etching methods (e.g., reactive ion etching). In other embodiments, the patterning of the gate stack material layers may alternatively use the gate HM 316 as an etching mask. The gate HM 316 is deposited on the gate electrode 314. A patterned resist layer is formed on the gate HM 316 by a lithography process. Then, the gate HM 316 is etched through openings of the patterned resist layer, thereby forming the patterned gate HM 316. The patterned resist layer may be removed thereafter using a suitable process, such as wet stripping or plasma ashing.

Referring again to FIGS. 5 and 2A-2B, the method 1000 proceeds to step 1008 by forming spacers 320 along sidewalls of the first gate stack 310. In one embodiment, a formation of the spacer 320 includes depositing a spacer material layer on the substrate 210 and the first gate stack 310, and thereafter performing an anisotropic etch to the spacer material layer, thereby forming the spacer 320. The deposition of the spacer material layer includes a suitable technique, such as CVD, PVD and/or ALD. The anisotropic etch may include a plasma etch in one example.

Referring to FIGS. 5 and 3A-3B, the method 1000 proceeds to step 1010 by recessing the fin feature 220 in the S/D region 232 to form the S/D recesses 410. The recessing process may include dry etching process, wet etching process, and/or combination thereof. The recessing process may also include a selective wet etch or a selective dry etch. A wet etching solution includes a TMAH, a HF/HNO$_3$/CH$_3$COOH solution, or other suitable solution. In the present embodiment, the S/D recesses 410 are formed by a selective etch process. The etch process selectively etches the fin feature 220 in the S/D region 232 but substantially does not etch the gate HM 316 and the spacer 320.

Referring to FIGS. 5 and 4A-CB, the method 1000 proceeds to step 1012 by forming source/drain features 420 to within the S/D recesses 410 (the plug-type portion) and continually extending to merge into the single structure (the merged portion). The S/D features 420 may be formed by epitaxial growing processes, such as CVD deposition techniques (e.g., vapor-phase epitaxy (VPE) and/or ultra-high vacuum CVD (UHV-CVD)), molecular beam epitaxy, and/or other suitable processes. In present embodiment, a formation of the S/D feature 420 starts at epitaxially growing a semiconductor material over the substrate 210 and within the S/D recess 410, continually overgrowing beyond top surfaces of the isolation regions 230 and merging into a single feature. The epitaxial growing process may include a cyclic deposition and etching (CDE) process, selective epitaxy growth (SEG) process, or/and other suitable processes.

In some embodiments, the CDE process is a two-cycle operation with a precursor having chlorine for deposition/etching effects so that the semiconductor material is selectively deposited over the substrate 210 within the S/D recesses 410. In the first cycle (deposition cycle), the various chemicals are used as precursor to epitaxially grow the semiconductor material. In the second cycle (etching cycle), chlorine-containing gas (such as HCl, Cl$_2$ or both) is used for etching. The CDE process repeats the two cycles until the S/D recesses 410 are filled and then overgrowing beyond the top surfaces of the isolation region 230.

In the SEG process, the deposition gas (chemicals for deposition) and etching gas (chlorine-containing gas, such as Cl$_2$ or HCl) are simultaneously flown to the processing chamber. Instead of two cycles, the operation is a continuous deposition/etching process that epitaxially grows the semiconductor material selectively over the substrate 210 within the S/D recesses 410. Thus, the disclosed deposition of the semiconductor material to the substrate 210 is insensitive to the metal residuals, eliminating the metal assisted silicon etching issue and the associated defects.

Figure 6:
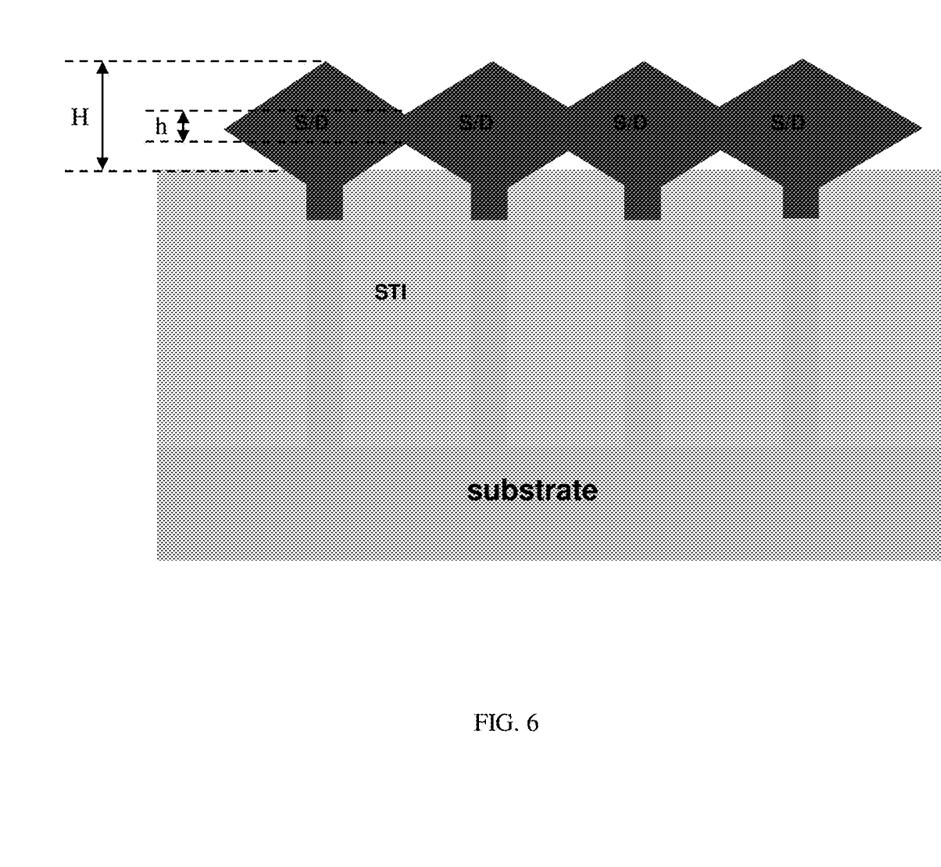
FIGS. 6 to 9 are cross-sectional views of an example FinFET device along the line A-A in FIG. 4A.

Usually when a semiconductor feature epitaxially grows from multiple individual recesses and overgrows to merge into a single feature, it results in having a substantial non-flat surface, as shown in FIG. 6. A ratio of a lowest height h to a highest height H is less than 70%. In the present embodiment, the growth process conditions are carefully controlled such that the merged portion 424 is formed with a quit flat top surface, as shown in FIG. 4B. As an example, the SiGe S/D feature 420 is formed by a CDE process, performed in an AMAT Centura epitaxial deposition equipment, having process temperature ranging from about 500° C. to about 700° C., processing chamber pressure ranging from about 30 torr to about 50 torr, a gas ratio of GeH$_4$ to DCS ranging from about 5 to about 10 and HCl flow less than 100 sccm.

In some embodiments, the FinFET device 200 includes an N-type FET (NFET) region and a P-type FET (PFET) region. The S/D features 420 may be different in compositions in the NFET region than in the PFET region. For example, the S/D features 420 in the NFET region are SiC doped with phosphorous and the S/D features 420 in the PFET region are SiGe doped with boron. As one example, the procedure to form S/D features 420 for both NFET region and PFET region includes: forming a first mask (soft mask or hard mask) to cover the NFET region; performing a first CDE (or SEG) process to form S/D features 420 of SiGe—B in the PFET region; removing the first mask; forming a second mask to cover the PFET region; performing a second CDE (or SEG) process to form S/D features 420 of SiC—P in the NFET region; and removing the second mask.

In one embodiment, an in-situ doping process may be performed during the epitaxially growth processes. In another embodiment, an implantation process (i.e., a junction implant process) is performed to dope the S/D feature 420. One or more annealing processes may be performed to activate dopants. The annealing processes comprise rapid thermal annealing (RTA) and/or laser annealing processes.

Figure 7:
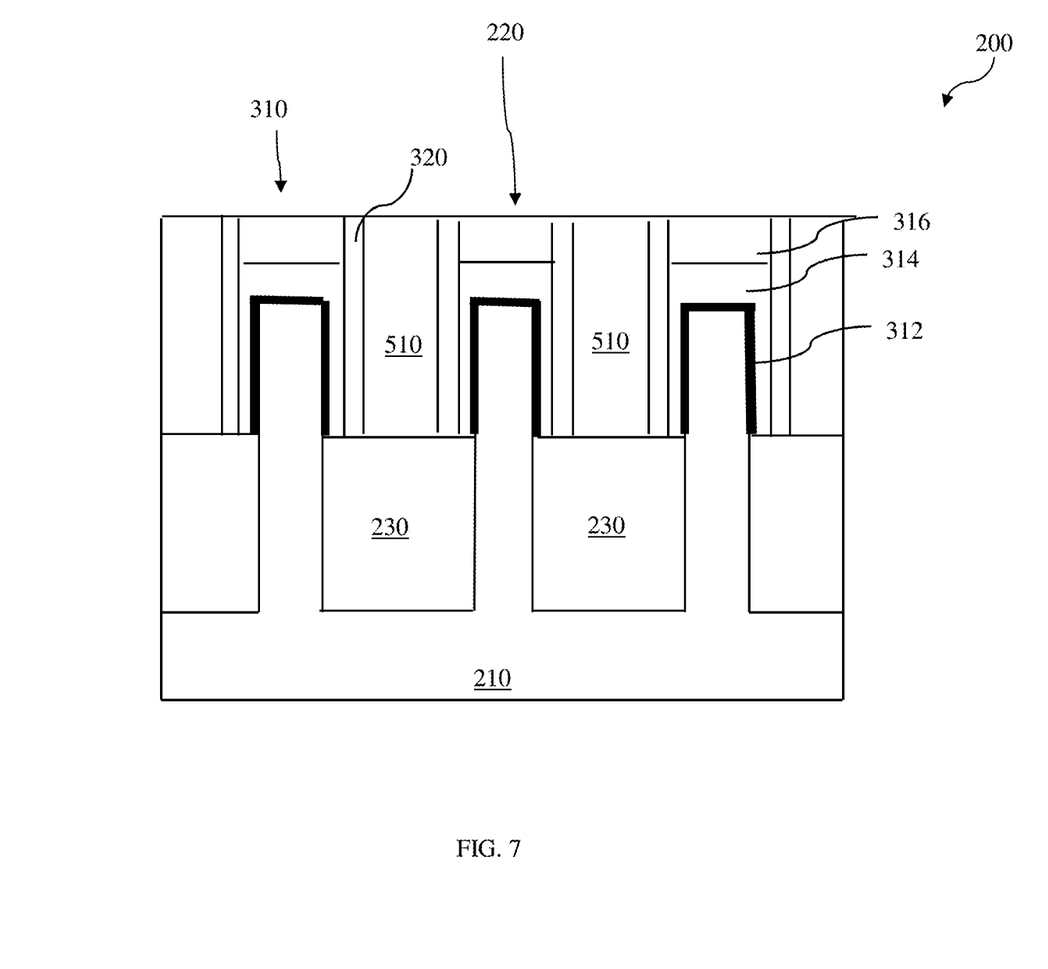

Additional steps can be provided before, during, and after the method 1000, and some of the steps described can be replaced or eliminated for other embodiments of the method. The FinFET devices 200 and 1000 may undergo further CMOS or MOS technology processing to form various features and regions. For example, an interlayer dielectric (ILD) layer 510 is formed over the substrate 210, including fully filling spaces between first gate stacks 310, as shown in FIG.

7. The ILD layer 510 may include silicon oxide, silicon oxynitride, silicon nitride, silicon carbide, silicon carbide nitride, low k dielectric material or other suitable dielectric materials. The ILD layer 510 is formed by a suitable technique, such as CVD, ALD and spin-on (SOG). A chemical mechanical polishing (CMP) process may be performed thereafter to remove excessive ILD layer 510 and planarize the top surface of the ILD layer 510 with the first gate stacks 310. In one embodiment, top surfaces of the first gate stack 310 are exposed after the CMP process.

Figure 8:
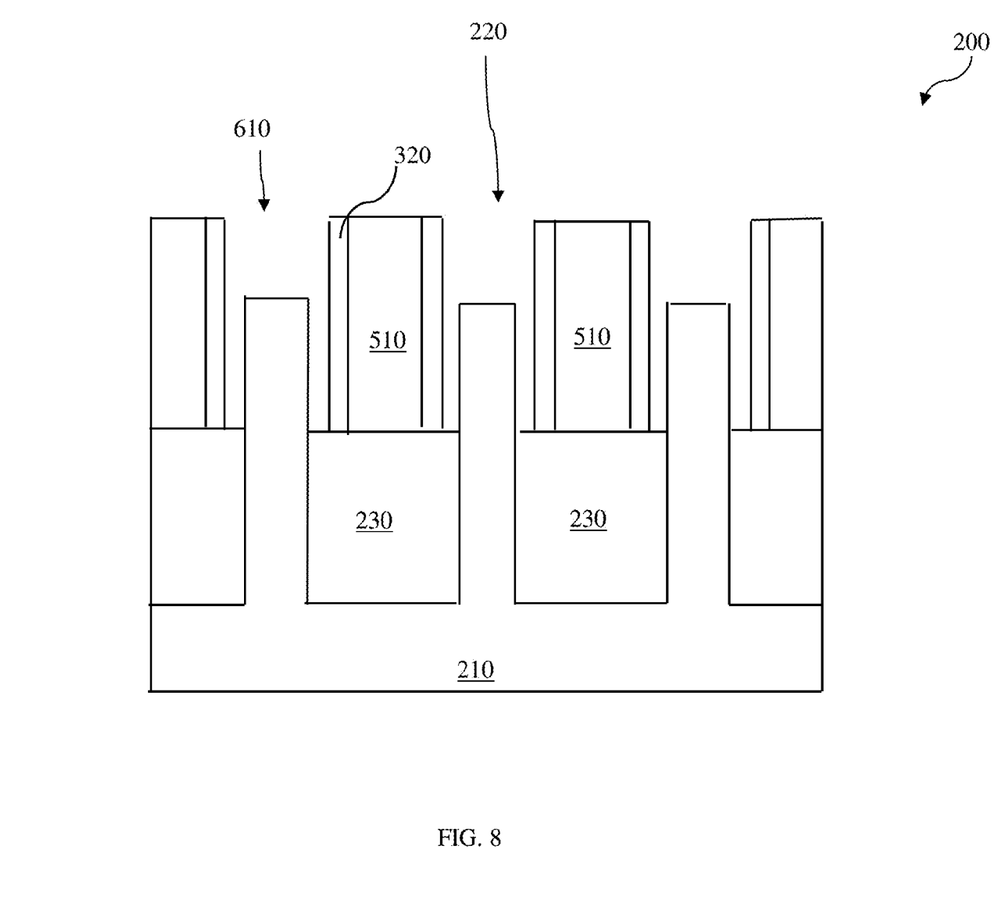

After depositing the ILD layer 510, the first gate stack 310 is removed to from a gate trench 610 and the upper portion of the fin feature 220 is exposed in the gate trench 610, as shown in FIG. 8. In one embodiment, the first gate stack 310 is removed by a selective etch process, including a selective wet etch or a selective dry etch.

Figure 9:
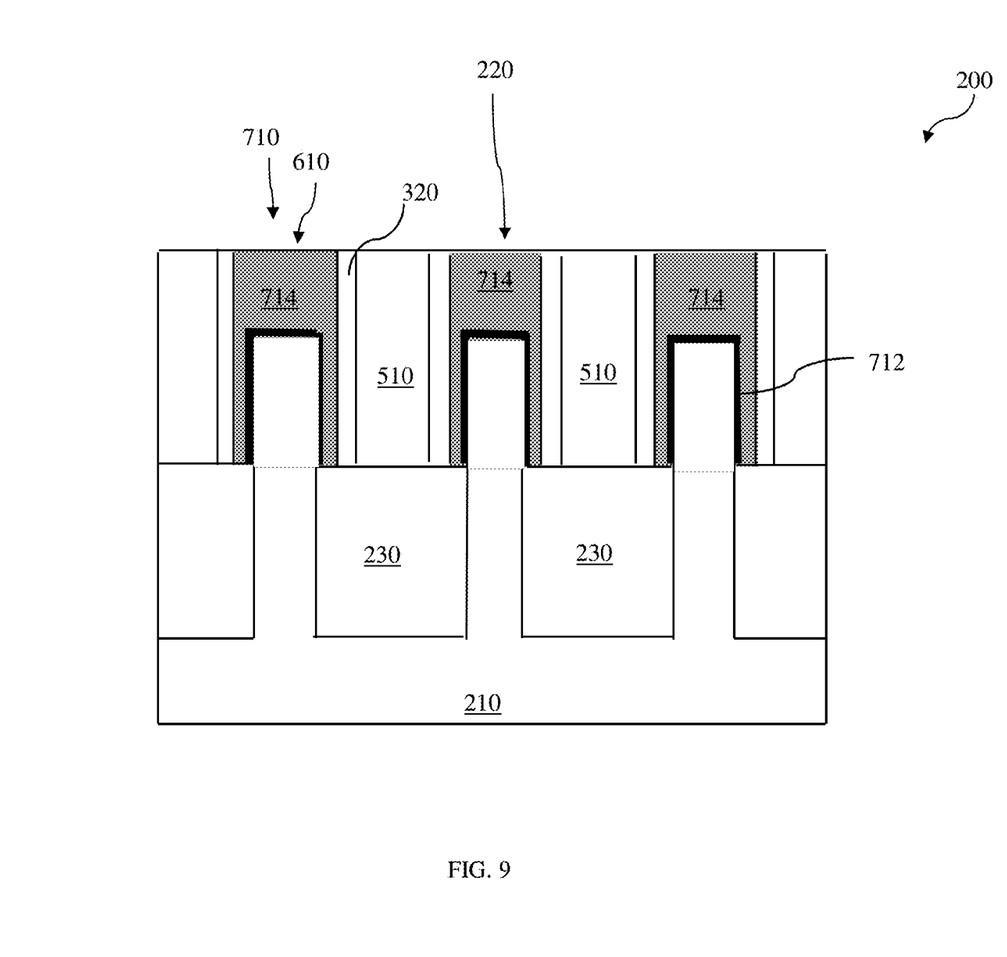

After the first gate stack 310 is removed to from the gate trench 610, a high-K/metal gate (HK/MG) 710 is formed over the substrate 210, including wrapping over the exposed upper portion of the fin feature 220 in the gate trench 610, as shown in FIG. 9. The HK/MG 710 may include gate dielectric layer 712 and MG electrode 714 disposed over the gate dielectric 712. In one embodiment, the gate dielectric layer 712 wraps over the upper portion of the fin feature 220 in a gate region, where a gate channel will be formed during operating the FinFET device 200. As has been mentioned previously, the merged portion 424 connects to multiple individual fin features 220 in the gate region 234, thus the S/D feature 420 induces stress to each individual gate channel region. Thus with a large volume of the merged portion 424, the S/D feature 420 may enhance strain effect on the channel region.

The gate dielectric layer 712 includes an interfacial layer (IL) and a HK dielectric layer. The IL is deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The MG electrode 714 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode 714 may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode 914 may be formed by ALD, PVD, CVD, or other suitable process. The MG electrode 914 may be formed separately for the N-FET and P-FFET with different metal layers. A CMP process may be performed to remove excessive MG electrode 714.

For another example, the FinFET devices 200 may include various contacts/vias/lines and multilayers interconnect features (e.g., metal layers and interlayer dielectrics) over the substrate 210. As an example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a S/D structure and a method of forming the S/D feature, which has a merged portion with a quite flat surface. The S/D structure demonstrates enhancing channel strain boosting and reducing S/D resistivity. The method of forming the S/D feature is very easy to be adapted by existing process flow of forming a merged S/D feature from multiple individual S/D recesses.

The present disclosure provides many different FinFET devices that provide one or more improvements over existing approaches. In one embodiment, a FinFET device includes a semiconductor substrate having a source/drain region, a plurality of isolation regions over the semiconductor substrate and a source/drain feature in the source/drain region. The source/drain feature includes a multiple plug-type portions over the substrate and each of plug-type portion is isolated each other by a respective isolation region. The source/drain feature also includes a single upper portion over the isolation regions. Here the single upper portion is merged from the multiple plug-type portions. The single upper portion has a flat top surface facing away from a top surface of the isolation region.

In another embodiment, a FinFET device includes a substrate having a source/drain (S/D) region, a plurality of isolation regions over the substrate and a silicon germanium (SiGe) S/D feature in the source/drain region. The SiGe S/D feature includes a multiple plug-type portions over the substrate and each of plug-type portions embedded in an isolation region. The SiGe S/D feature also includes a single upper portion over the isolation region. The single upper portion is merged from the multiple plug-type portions, wherein the single upper portion has a top surface, facing away from a top surface of the isolation region, having a flat surface connects with a multi-facet surface in a repetitive manner.

In yet another embodiment, a method of fabricating a FinFET device includes forming a plurality of fin features over a substrate, forming isolation regions between fin features, recessing fin features in a source/drain region to form source/drain recesses, growing a semiconductor layer in each of the source/drain recess and overgrowing the semiconductor layer from each of the source/drain recess to merge to a single structure with a flat top surface and a flat bottom surface.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A device comprising:
a semiconductor substrate having a source/drain region;
a plurality of isolation regions over the semiconductor substrate; and
a source/drain feature in the source/drain region, the source/drain feature including:
multiple plug-type portions over the substrate, wherein each of the plug-type portions is isolated from each other by a respective isolation region; and a single upper portion over the isolation regions, wherein the single upper portion is merged from the multiple plug-type portions, wherein the single upper portion has a top surface facing away from a top surface of the isolation regions, wherein the top surface of the single upper portion includes a first flat surface connected to a multi-facet surface and a second flat surface connected to the multi-facet surface.

2. The device of claim 1, wherein the single upper portion having the top surface is such that a ratio of the lowest height to the highest height of the single upper portion of the semiconductor feature is more than about 90%.

3. The device of claim 1, wherein a height of the plug-type portion of the source/drain feature is larger than about 10 nm.

4. The device of claim 1, wherein the source/drain feature includes epitaxial silicon germanium (SiGe).

5. The device of claim 1, further includes:
a gate region adjacent to the source/drain region;
a plurality of fin feature in the gate region, wherein the plurality of fin features physically contact the same single upper portion of the source/drain feature; and
gate stacks disposed over the substrate, including wrapping over the respective fin feature.

6. The device of claim 1, further includes a semiconductor layer wraps over the source/drain feature, wherein the semiconductor layer has a different semiconductor material than the source/drain feature.

7. The device of claim 1, wherein the plug-type portions of the S/D feature physically contact the substrate.

8. A fin-like field-effect transistor (FinFET) device comprising:
a substrate having a source/drain (S/D) region;
a plurality of isolation regions over the substrate; and
a silicon germanium (SiGe) S/D feature in the source/drain region, the SiGe S/D feature including:
multiple plug-type portions over the substrate, wherein each plug-type portion is embedded in an isolation region; and
a single upper portion over the isolation region, wherein the single upper portion is merged from the multiple plug-type portions, wherein the single upper portion has a top surface, facing away from a top surface of the isolation region, having a flat surface connects with a multi-facet surface in a repetitive manner.

9. The device of claim 8, wherein the multi-facet surface is aligned to the respective plug-type portion.

10. The device of claim 8, wherein the multi-facet surface includes two facets, wherein:
each of two facets has a fix angle with the flat surface;
one of two facets starts from the flat surface and meets an end of the another facet which also starts from the flat surface.

11. The device of claim 10, wherein a ratio of a distance between the end where two facets meet and a top surface of the isolation region 230 to a distance between the flat surface and a top surface of the isolation region is more than about 90%.

12. The device of claim 10, wherein the two facets has (111) crystal plane orientation.

13. The device of claim 8, further includes:
a gate region adjacent to the source/drain regions;
a plurality of fin feature in the gate region, wherein the plurality of fin features physically contact the same single upper portion of the SiGe S/D feature; and
gate stacks disposed over the substrate, including wrapping over the respective fin feature.

14. The device of claim 8, wherein the plug-type portion of the SiGe S/D feature physically contact the substrate.

15. The device of claim 8, wherein a height of the plug-type portion of the SiGe S/D feature is larger than about 10 nm.

16. The device of claim 8, further includes a semiconductor layer over the semiconductor feature, wherein the semiconductor layer has a different semiconductor material than the semiconductor feature.

17. A device comprising:
a semiconductor substrate having a source/drain region;
a plurality of isolation regions over the semiconductor substrate; and
a source/drain feature in the source/drain region, the source/drain feature including:
three plug-type portions over the substrate, wherein the plug-type portions are isolated from each other by two isolation regions; and
a single upper portion over the two isolation regions, wherein the single upper portion is merged from the three plug-type portions, wherein the single upper portion has a top surface facing away from a top surface of the isolation regions, wherein the top surface of the single upper portion includes a first flat surface connected to a multi-facet surface and a second flat surface connected to the multi-facet surface.

18. The device of claim 17, wherein the single upper portion having the top surface is configured such that a ratio of the lowest height to the highest height of the single upper portion of the semiconductor feature is more than about 90%.

19. The device of claim 17, wherein a height of the plug-type portions of the source/drain feature is larger than about 10 nm.

20. The device of claim 17, wherein the source/drain feature includes epitaxial silicon germanium (SiGe).

* * * * *